United States Patent
Lazur

(10) Patent No.: US 9,963,396 B2
(45) Date of Patent: May 8, 2018

(54) ENVIRONMENTAL BARRIER FIBER COATING

(71) Applicant: Rolls-Royce Corporation, Indianapolis, IN (US)

(72) Inventor: Andrew J. Lazur, Huntington Beach, CA (US)

(73) Assignee: Rolls-Royce Corporation, Indianapolis, IN (US)

( * ) Notice: Subject to any disclaimer, the term of this patent is extended or adjusted under 35 U.S.C. 154(b) by 0 days. days.

(21) Appl. No.: 15/591,777

(22) Filed: May 10, 2017

(65) Prior Publication Data

US 2017/0240474 A1 Aug. 24, 2017

Related U.S. Application Data

(62) Division of application No. 14/207,102, filed on Mar. 12, 2014, now Pat. No. 9,676,674.

(Continued)

(51) Int. Cl.
| | | |
|---|---|---|
| *C04B 35/52* | (2006.01) | |
| *C04B 35/80* | (2006.01) | |
| *C04B 35/565* | (2006.01) | |
| *C04B 35/628* | (2006.01) | |
| *C09D 1/00* | (2006.01) | |

(Continued)

(52) U.S. Cl.
CPC ............ *C04B 35/806* (2013.01); *C04B 35/52* (2013.01); *C04B 35/565* (2013.01); *C04B 35/6286* (2013.01); *C04B 35/62863* (2013.01); *C04B 35/62868* (2013.01); *C04B 35/62871* (2013.01); *C04B 35/62884* (2013.01); *C04B 35/62894* (2013.01); *C04B 35/62897* (2013.01); *C09D 1/00* (2013.01); *C09D 5/00* (2013.01); *C23C 16/325* (2013.01); *C23C 16/342* (2013.01); *C04B 2235/5244* (2013.01);

(Continued)

(58) Field of Classification Search
CPC .............................. D06M 11/77; D06M 11/80
USPC ......................... 428/357, 364, 366, 375, 378
See application file for complete search history.

(56) References Cited

U.S. PATENT DOCUMENTS

| | | |
|---|---|---|
| 4,275,095 A | 6/1981 | Warren |
| 4,405,685 A | 9/1983 | Honjo et al. |

(Continued)

FOREIGN PATENT DOCUMENTS

| | | |
|---|---|---|
| EP | 1 059 274 A1 | 12/2000 |
| EP | 1 059 274 B1 | 12/2005 |
| EP | 2 284 137 A2 | 2/2011 |

OTHER PUBLICATIONS

Bhatt et al. Impact resistance of environmental barrier coated SiC/SiC composites. Materials Science and Engineering A 476 (2008) 8-19.*

(Continued)

*Primary Examiner* — Noah S Wiese
(74) *Attorney, Agent, or Firm* — Brinks Gilson & Lione

(57) ABSTRACT

A fiber having an environmental barrier coating is provided that includes, in one illustrative form, a Hi Nicalon preform assembled in a tooling for chemical vapor infiltration and cleaned to remove sizing char from fibers of the Hi Nicalon preform; a ytterbium doped silicon carbide coat located over the Hi Nicalon preform; a boron nitride interface coat applied over the ytterbium doped silicon carbide coat; and a silicon carbide coat applied over the boron nitride interface coat.

12 Claims, 1 Drawing Sheet

Related U.S. Application Data

(60) Provisional application No. 61/784,653, filed on Mar. 14, 2013.

(51) Int. Cl.
  *C09D 5/00* (2006.01)
  *C23C 16/32* (2006.01)
  *C23C 16/34* (2006.01)

(52) U.S. Cl.
  CPC ........... *C04B 2235/5248* (2013.01); *C04B 2235/6025* (2013.01); *C04B 2235/614* (2013.01); *C04B 2235/616* (2013.01)

(56) References Cited

U.S. PATENT DOCUMENTS

| | | | |
|---|---|---|---|
| 4,668,579 A | | 5/1987 | Strangman et al. |
| 5,055,430 A | * | 10/1991 | Sakamoto ............... C04B 35/80 428/292.1 |
| 5,260,125 A | | 11/1993 | Copes |
| 5,332,619 A | | 7/1994 | Lacoste et al. |
| 5,354,615 A | * | 10/1994 | Tenhover ............... C04B 41/009 428/366 |
| 5,455,106 A | | 10/1995 | Steffier |
| 5,480,707 A | | 1/1996 | Steffier |
| 5,648,028 A | | 7/1997 | Miyake et al. |
| 6,228,453 B1 | | 5/2001 | Fareed et al. |
| 6,376,074 B1 | | 4/2002 | Everett et al. |
| 6,896,968 B2 | | 5/2005 | Golecki |
| 7,510,742 B2 | | 3/2009 | Kmetz |
| 8,114,799 B2 | | 2/2012 | Subramanian et al. |
| 8,221,836 B2 | | 7/2012 | Philippe et al. |
| 9,676,674 B2 | * | 6/2017 | Lazur ...................... C04B 41/85 |
| 2007/0054103 A1 | | 3/2007 | Fareed et al. |
| 2009/0088038 A1 | | 4/2009 | Kmetz |
| 2011/0027517 A1 | | 2/2011 | Kirby et al. |

OTHER PUBLICATIONS

Kusakabe et al. Coating of Carbon Fibers With Amorphous SiC Films As Diffusion Barriers by Chemical Vapor Deposition With Triisopropylsilane. Carbon vol. 34, No. 2, pp. 179-185, 1996.*

Xu et al. Carbon/silicon carbide composites prepared by chemical vapor infiltration combined with silicon melt infiltration. Carbon 37 (1999) 1179-1187.*

Choi et al., "Oxidation Behavior of Liquid-Phase Sintered Silicon Carbide with Aluminum Nitride and Rare-Earth Oxides ($Re_2O_3$, where Re = Y, Er, Yb)," *J. Am. Ceram. Soc.*, 85, 9 (2002), pp. 2281-2286.

* cited by examiner

ENVIRONMENTAL BARRIER FIBER COATING

RELATED APPLICATIONS

The present patent document is a division of U.S. patent application Ser. No. 14/207,102, filed on Mar. 12, 2014, which claims priority to U.S. Provisional Patent Application Ser. No. 61/784,653, filed on Mar. 14, 2013. The above-referenced patent applications are hereby incorporated by reference in their entirety.

FIELD OF THE DISCLOSURE

The present disclosure is related to environmental barrier coatings, and particularly to environmental barrier coatings located adjacent the fiber.

BACKGROUND AND SUMMARY

Economical and environmental concerns, e.g., improving efficiency and reducing emissions, are driving forces behind the ever increasing demand for higher gas turbine inlet temperatures. A limitation to the efficiency and emissions of many gas turbine engines is the temperature capability of hot section components such as blades, vanes, blade tracks, and combustor liners. Technology improvements in cooling, materials, and coatings are required to achieve higher inlet temperatures. As the temperature capability of Ni-based superalloys has approached their intrinsic limit, further improvements in their temperature capability have become increasingly difficult. Therefore, the emphasis in gas turbine materials development has shifted to thermal barrier coatings (TBC) and next generation, high temperature materials, such as ceramic-based materials.

Silicon carbide/silicon carbide (SiC/SiC) ceramic matrix composite (CMC) materials are prime candidates to replace Ni-based superalloys for hot section structural components for next generation gas turbine engines. The key benefit of SiC/SiC CMC engine components is their excellent high temperature mechanical, physical, and chemical properties which allow gas turbine engines to operate at much higher temperatures than the current engines having superalloy components. SiC/SiC CMCs also provide the additional benefit of damage tolerance, which monolithic ceramics do not possess.

The present disclosure is related to environmental barrier coatings that extend the life of components in a turbine environment.

An illustrative embodiment of the present disclosure provides a fiber having an environmental barrier coating, comprising: a Hi Nicalon preform assembled in a tooling for chemical vapor infiltration and cleaned to remove sizing char from fibers of the Hi Nicalon preform; a ytterbium doped silicon carbide coat located over the Hi Nicalon preform; a boron nitride interface coat applied over the ytterbium doped silicon carbide coat; and a silicon carbide coat applied over the boron nitride interface coat.

In the above and other illustrative embodiments the fiber having the environmental barrier coating may further comprise: the boron nitride interface coat has a thickness of about 0.5 µm; the silicon carbide coat has a thickness of about 2 µm; the Hi Nicalon preform includes about 36% fiber volume and cleaned using air at about 600 degrees C.; the preform being completed with slurry and melt infiltration; the ytterbium doped silicon carbide coat being applied by chemical vapor infiltration; and the silicon carbide coat being applied by chemical vapor infiltration.

Another illustrative embodiment of the present disclosure provides a fiber having an environmental barrier coating, comprising: a Hi Nicalon S fiber; the Hi Nicalon S fiber is coated in tow form with yttrium doped silicon carbide; and a silicon doped boron nitride coat applied over the yttrium doped silicon carbide.

In the above and other illustrative embodiments the fiber having the environmental barrier coating may further comprise: the Hi Nicalon S fiber being coated with about 1 µm of the yttrium doped silicon carbide; the silicon doped boron nitride coat having a thickness of about 0.3 µm; the fiber being coated with silicon nitride of about 0.3 µm and silicon carbide of about 0.1 µm; the tow is processed with a silicon carbide slurry and binders to form a unidirectional tape; the uni-directional tape is laminated and shaped, then cured; a resulting body being infiltrated with silicon to complete a CMC component; the yttrium doped silicon carbide being applied by a chemical vapor deposition process; and the silicon doped boron nitride coat being applied by the chemical vapor deposition process.

Another illustrative embodiment of the present disclosure provides a fiber having an environmental barrier coating, comprising: a T-300 carbon fiber preform assembled in tooling for chemical vapor infiltration; alternating layers of silicon carbide and boron carbide are applied over the preform; and a silicon doped boron nitride interface coat applied over the silicon carbide coat.

In the above and other illustrative embodiments the fiber having the environmental barrier coating may further comprise: the T-300 carbon fiber preform includes about 36% fiber volume, the silicon carbide coat and boron carbide coat each have a thickness of about 0.1 µm each for a total of 0.7 µm; and wherein the silicon doped boron nitride interface coat has a thickness of about 0.5 µm; the matrix densification continues by chemical vapor infiltration with alternating layers of silicon carbide and boron carbide at about a nominal thickness of about 0.1 µm until full density is achieved; and the alternating layers of silicon carbide and boron carbide include four layers of silicon carbide and three layers of boron carbide.

It should be appreciated that the present application discloses one or more of the features recited in the appended claims and/or the following features which alone or in any combination may comprise patentable subject matter.

DETAILED DESCRIPTION

The present disclosure includes a fiber coating that incorporates at least one layer prior to the fiber interface coating to improve chemical compatibility of the fiber and interface coating. Illustratively, the first coating is bonded to the fiber and is followed by an interface coating and, optionally, additional coatings. The coating may be a slightly altered composition of the fiber or a totally different composition. The coating acts as a barrier to oxygen and steam when the composite is cracked or the fiber is exposed on the edges or the surface. The coating may inherently be resistant to high temperature oxygen, steam and other fiber damaging compounds or it may react with the environment to create a stable, protective compound.

The coating may also "heal" surface flaws on the fiber and increase the effective fiber volume by increasing the diameter of the fiber. The coating may be uniform in composition and structure, graded intentionally to produce a better match between the fiber and the interface coating or consist of multiple thin layers prior to the interface coating. The coating may also be followed by other functional coatings prior to the interface coating to improve structural performance or improve compatibility with the interface coating, or interface coating deposition process.

An oxidation resistant coating may range from about 0.01 µm to about 2 µm. The coating may be deposited by chemical vapor deposition, physical vapor deposition (including directed vapor deposition) or other suitable means. The fiber in the composite could be carbon, ceramic (silicon carbide, alumina, aluminosilicate, SiNC, etc.) or glass. The coating (or coating layers) may include elemental, binary or ternary compounds of the following elements: carbon, nitrogen, oxygen, silicon, germanium, boron, aluminum, titanium, zirconium, hafnium, vanadium, niobium, tantalum, chromium, molybdenum, nickel, scandium, yttrium, ytterbium and rhenium.

Illustratively, it may be desirable to tailor the coating composition and/or structure to produce a slightly lower modulus than the fiber to reduce stress in the coating layer and delay surface cracking.

Prior to the structural coating, the fiber may be cleaned to remove polymer fiber coatings (sizing). This may be done at any time prior to the coating using solvents, hot air, other hot gases or other means. The cleaning process may enhance the bonding between the fiber and oxidation barrier coating.

Figure 1:
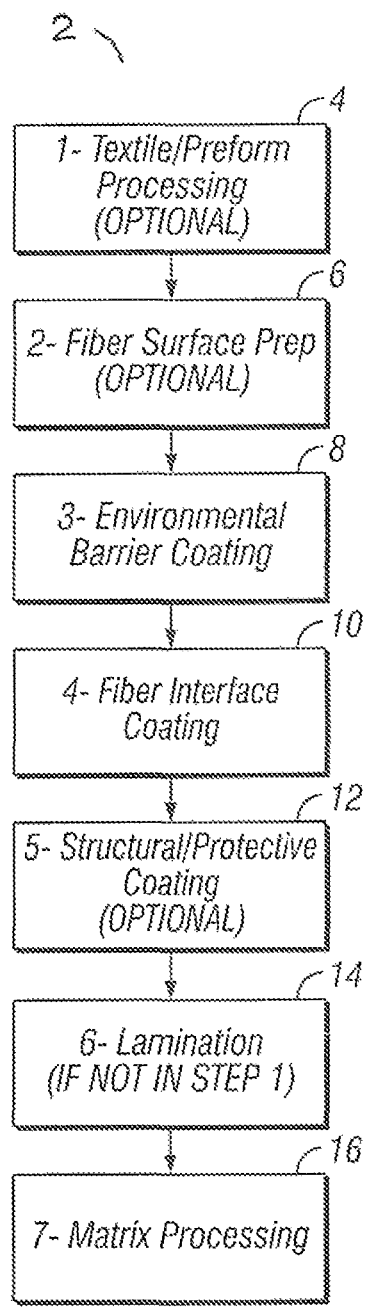
FIG. 1 is a flow diagram showing a process for applying an environmental barrier coating on a fiber or preform matrix.

A flow diagram depicting a process of applying the environmental barrier coating on fiber 2 is shown in FIG. 1. Process 2 includes first providing a fiber material, textile, or preform for processing at 4. The material may illustratively be prepared by cleaning and heating it as indicated at 6 to remove sizing char, for example. The fiber may then be coated with its first environmental barrier coating at 8. Such a coating may be ytterbium doped silicon carbide. After coating 8, a fiber interface coating 10, such as a boron nitride coating may be applied over top. Next, structural and protective coatings 12 may be applied over the interface coating 10. Such an illustrative example includes a silicon carbide coating. Additional fiber layers may be applied at 14. Lastly, a CMC matrix 16 may be completed with slurry and melt infiltration.

Figure 2:
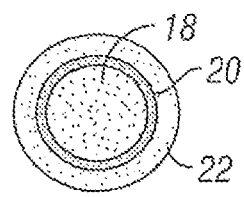
FIG. 2 is an end sectional view of an illustratively-shaped PRIOR ART composite.

An end cross-sectional view of a PRIOR ART fiber material 18 and coating is shown in FIG. 2. The prior art coating includes an interface coating 20 surrounding the periphery of fiber material 18. Structural layer 22 is then applied over interface coating 20.

Figure 3:
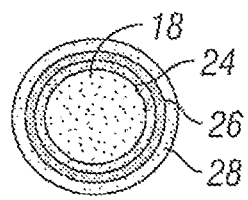
FIG. 3 is an end sectional view of one embodiment of an environmental barrier fiber coating.

In contrast, the end sectional view of fiber material 18 in FIG. 3 includes environmental barrier coating 24. This coating is applied according to step 8 from FIG. 1. An interface coating 26 as applied at 10 in FIG. 1 is then applied over environmental barrier coating 24. And lastly, structural layer 28 is applied over interface coating 26 as described with respect to step 12 in FIG. 1.

Advantages may include extending fiber life and, therefore, composite life; reducing or eliminating damage to fiber surfaces during interface coating deposition (e.g. incompatibility of carbon and boron nitride deposition); providing additional layers that provide an opportunity to manage thermal and mechanical incompatibilities between a fiber and subsequent coatings; increasing ultimate strength resulting from surface defect reduction; and increasing creep strength if the fiber coating has a higher creep capability than the fiber.

Figure 4:
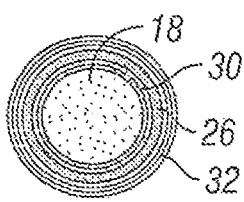
FIG. 4 is an end sectional view of an environmental barrier multi-layer fiber coating.

The view of FIG. 4 shows fiber 18 having a multi-layer environmental barrier coating 30 applied over top. The interface coating 26 is then applied over coating 30. And a structural layer or EBC multi-layer 32 is applied over interface coating 26.

The following are non-limiting illustrative embodiments of environmental barrier coatings:
Preform Based CMC
1. A Hi Nicalon preform is constructed at 36% fiber volume and assembled in tooling for Chemical Vapor Infiltration (CVI);
2. the preform is cleaned using air at about 600 degrees C. to remove sizing char from the fiber;
3. the fiber is coated with 1 µm of ytterbium doped silicon carbide (SiC) by CVI;
4. a boron nitride (BN) interface coating is applied at 0.5 µm;
5. a SiC coating of 2 µm is applied by CVI; and
6. the CMC matrix is completed with slurry and melt infiltration.

The composite demonstrates improved life after matrix cracking as a result of the well-bonded, environmentally resistant layer on the fiber.
CMC Made With Pre-Coated Fiber
1. A Hi Nicalon S fiber is coated in tow form with 1 µm of yttrium doped SiC by a chemical vapor deposition (CVD) process;
2. a subsequent CVD process applies a silicon doped boron nitride coating of 0.3 µm;
3. the fiber in the tow is coated with silicon nitride of 0.3 µm and SiC of 0.1 µm;
4. the tow is processed with a SiC slurry and binders to form a unidirectional tape;
5. the tapes are laminated and shaped then cured; and
6. the resulting body is infiltrated with Si to complete the CMC component.

The composite demonstrates improved life after matrix cracking as a result of the well-bonded, environmentally resistant layer on the fiber.
Preform Based CMC II
1. A T-300 carbon fiber preform is constructed at 36% fiber volume and assembled in tooling for CVI;
2. the fiber is coated with alternating layers of SiC (four layers) and boron carbide (three layers) nominally 0.1 µm each for a total of 0.7 µm;
3. a silicon doped BN interface coating is applied at 0.5 µm; and
4. matrix densification continues by CVI with alternating layers of SiC and boron carbide nominally 0.1 µm thick until full density is achieved.

The composite demonstrates improved life after matrix cracking and interface coating cracking as a result of the well-bonded, environmentally resistant layer on the fiber. It may be beneficial to use both a coating to protect the fiber that is well bonded (this disclosure) in conjunction with a fiber interface coating that demonstrates improved environmental resistance.

While the disclosure has been described in this detailed description, the same is to be considered as exemplary and not restrictive in character, it being understood that only illustrative embodiments thereof have been described and that changes and modifications that come within the spirit of the disclosure are desired to be protected.

What is claimed is:

1. A fiber having an environmental barrier coating, the fiber comprising:
    a silicon carbide fiber;
    an environmental barrier coating comprising yttrium doped silicon carbide on the silicon carbide fiber; and
    an interface coating comprising silicon doped boron nitride applied over the environmental barrier coating.

2. The fiber of claim 1, further comprising a structural coating applied over the interface coating.

3. The fiber of claim 2, wherein the structural coating comprises multiple layers.

4. The fiber of claim 3, wherein the multiple layers include a silicon nitride layer and a silicon carbide layer.

5. The fiber of claim 4, wherein the silicon nitride layer is about 0.3 μm in thickness and the silicon carbide layer is about 0.1 μm in thickness.

6. The fiber of claim 1, wherein the environmental barrier coating has a thickness from about 0.01 micron to about 2 microns.

7. The fiber of claim 6, wherein the environmental barrier coating has a thickness of 1 μm.

8. The fiber of claim 1, wherein the interface coating has a thickness of about 0.3 μm.

9. The fiber of claim 1, wherein the environmental barrier coating is bonded to the silicon carbide fiber.

10. The fiber of claim 1, further comprising other functional coatings between the environmental barrier coating and the interface coating.

11. The fiber of claim 1, wherein the silicon carbide fiber comprises a Hi Nicalon S fiber.

12. The fiber of claim 1, wherein the silicon carbide fiber is coated in tow form.

* * * * *